United States Patent
Zeng

(10) Patent No.: US 11,205,690 B2
(45) Date of Patent: Dec. 21, 2021

(54) DISPLAY PANEL AND ELECTRONIC DEVICE

(71) Applicant: Shenzhen China Star Optoelectronics Semiconductor Display Technology Co., Ltd., Guangdong (CN)

(72) Inventor: Weijing Zeng, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 65 days.

(21) Appl. No.: 16/492,166

(22) PCT Filed: Apr. 24, 2019

(86) PCT No.: PCT/CN2019/083986
§ 371 (c)(1),
(2) Date: Sep. 9, 2019

(87) PCT Pub. No.: WO2020/206737
PCT Pub. Date: Oct. 15, 2020

(65) Prior Publication Data
US 2020/0328265 A1   Oct. 15, 2020

(30) Foreign Application Priority Data

Apr. 9, 2019   (CN) .......................... 201910279315.7

(51) Int. Cl.
*H01L 27/32* (2006.01)
*H01L 29/423* (2006.01)
(Continued)

(52) U.S. Cl.
CPC ...... *H01L 27/3262* (2013.01); *H01L 27/3258* (2013.01); *H01L 27/3272* (2013.01);
(Continued)

(58) Field of Classification Search
CPC ............ H01L 27/3262; H01L 27/3258; H01L 27/3272; H01L 29/42384; H01L 29/78633;
(Continued)

(56) References Cited

U.S. PATENT DOCUMENTS

2015/0001576 A1*  1/2015  Iwata .................. H01L 51/5256
                                                                                         257/100
2016/0291434 A1* 10/2016  Sugimoto ............. G02F 1/1368
(Continued)

*Primary Examiner* — Shahed Ahmed
(74) *Attorney, Agent, or Firm* — Mark M. Friedman

(57) ABSTRACT

A display panel and an electronic device are provided. The display panel includes a plurality of thin film transistors, the thin film transistor includes: a first metal layer, a second metal layer, an active region, a gate dielectric layer, a gate metal layer, an interlayer dielectric layer, a source metal layer, and a drain metal layer. The active region includes a channel region, a source region, and a drain region. The source metal layer is electrically connected to the source region and the first metal layer through a via hole. The drain metal layer is electrically connected to the drain region and the second metal layer through a via hole.

14 Claims, 1 Drawing Sheet

(51) Int. Cl.
*H01L 29/786* (2006.01)
*H01L 27/12* (2006.01)

(52) U.S. Cl.
CPC .... *H01L 27/3279* (2013.01); *H01L 29/42384* (2013.01); *H01L 29/78633* (2013.01); *H01L 27/124* (2013.01); *H01L 27/1248* (2013.01)

(58) Field of Classification Search
CPC ............ H01L 27/3279; H01L 27/1248; H01L 27/124; H01L 27/326; H01L 29/78648; H01L 27/1214–1296; H01L 27/3244–3279; G02F 1/136209; G02F 1/133512
See application file for complete search history.

(56) References Cited

U.S. PATENT DOCUMENTS

| | | | | |
|---|---|---|---|---|
| 2018/0122886 A1* | 5/2018 | Kim | ................ | H01L 27/1255 |
| 2019/0103060 A1* | 4/2019 | Kang | ................ | H01L 51/5206 |
| 2019/0165001 A1* | 5/2019 | Yao | ................ | H01L 27/1262 |
| 2020/0105789 A1* | 4/2020 | Fang | ................ | H01L 27/1259 |

* cited by examiner

DISPLAY PANEL AND ELECTRONIC DEVICE

CROSS REFERENCE TO RELATED APPLICATION

This application claims the priority of International Application No. PCT/CN2019/083986, filed on 2019 Apr. 24, which claims priority to Chinese Application No. 201910279315.7, filed on 2019 Apr. 9. The entire disclosures of each of the above applications are incorporated herein by reference.

BACKGROUND OF INVENTION

Field of Invention

The present invention relates to the field of display technologies, and in particular, to a display panel and electronic device.

Description of Prior Art

In order to reduce capacitive coupling influence of on impedance of a system, a thin film transistor layer of a display panel usually adopts a top gate type thin film transistor to reduce signal line load.

Technical Problems

For large or supersized displays, resistance of the signal lines cannot be ignored. This resistor consumes power supply voltage and causes uneven brightness on the display panel. Therefore, it is necessary to propose a thin film transistor structure capable of eliminating a voltage drop of the signal line.

SUMMARY OF INVENTION

The invention provides a display panel and an electronic device, which can effectively reduce the resistance of a signal line in the display panel.

In order to solve the above problems, the present invention provides a display panel including:
a substrate;
a thin film transistor layer, wherein the thin film transistor layer is located on the substrate;
a light emitting structure, wherein the light emitting structure is located on the thin film transistor layer;
wherein the thin film transistor layer comprises a plurality of thin film transistors, and the thin film transistor comprises:
a first metal layer and a second metal layer located on the substrate;
a buffer layer covering the first metal layer and the second metal layer;
an active region covering the buffer layer over the first metal layer, the active region comprising a channel and a source and a drain on two sides of the channel respectively;
a gate dielectric layer covering the active region;
a gate metal layer covering the gate dielectric layer over the active region;
an interlayer dielectric layer covering the gate metal layer;
a source metal layer located on the interlayer dielectric layer and electrically connected to the source and the first metal layer through a via hole;
a drain metal layer located on the interlayer dielectric layer and electrically connected to the drain and the second metal layer through a via hole;
a planarization layer covering the source metal layer, the drain metal layer, and the interlayer dielectric layer.

According to one aspect of the invention, the first metal layer and the second metal layer are light-shielding metal layers.

According to one aspect of the invention, the light emitting structure comprises a layer of a light emitting material, a projection of the layer of the light emitting material on the substrate does not overlap with the first metal layer and the second metal layer.

According to one aspect of the invention, the first metal layer and the second metal layer are electrically insulated.

According to one aspect of the invention, a projection of the first metal layer on the buffer layer covers a projection of the active region on the buffer layer.

According to one aspect of the invention, an area of the first metal layer is greater than or equal to a sum of an area of the active region and an area of the source metal layer.

According to one aspect of the invention, the plurality of thin film transistors are arranged in an array, the array comprises at least a row of thin film transistors arranged in a first direction and at least a column of thin film transistors arranged in a second direction;
wherein the second metal layers of the plurality of thin film transistors in a same row are electrically connected, and the second metal layers of the plurality of thin film transistors in a same column are electrically insulated.

According to one aspect of the invention, a surface of the light-shielding metal layer adjacent to the substrate has a uniformly distributed diffuse reflection structure.

According to one aspect of the invention, a surface of the light-shielding metal layer adjacent to the substrate has a uniformly undulating wave-like structure.

The present invention further provides an electronic device including a display panel, wherein the display panel comprises:
a substrate;
a thin film transistor layer, wherein the thin film transistor layer is located on the substrate;
a light emitting structure, wherein the light emitting structure is located on the thin film transistor layer; wherein
wherein the thin film transistor layer comprises a plurality of thin film transistors, and the thin film transistor comprises:
a first metal layer and a second metal layer located on the substrate;
a buffer layer covering the first metal layer and the second metal layer;
an active region covering the buffer layer over the first metal layer, the active region comprising a channel and a source and a drain on two sides of the channel respectively;
a gate dielectric layer covering the active region;
a gate metal layer covering the gate dielectric layer over the active region;
an interlayer dielectric layer covering the gate metal layer;
a source metal layer located on the interlayer dielectric layer and electrically connected to the source and the first metal layer through a via hole;
a drain metal layer located on the interlayer dielectric layer and electrically connected to the drain and the second metal layer through a via hole;
a planarization layer covering the source metal layer, the drain metal layer, and the interlayer dielectric layer.

According to one aspect of the invention, the first metal layer and the second metal layer are light-shielding metal layers.

According to one aspect of the invention, the light emitting structure comprises a layer of a light emitting material, a projection of the layer of the light emitting material on the substrate does not overlap with the first metal layer and the second metal layer.

According to one aspect of the invention, the first metal layer and the second metal layer are electrically insulated.

According to one aspect of the invention, a projection of the first metal layer on the buffer layer covers a projection of the active region on the buffer layer.

According to one aspect of the invention, an area of the first metal layer is greater than or equal to a sum of an area of the active region and an area of the source metal layer.

According to one aspect of the invention, the plurality of thin film transistors are arranged in an array, the array comprises at least a row of thin film transistors arranged in a first direction and at least a column of thin film transistors arranged in a second direction;

wherein the second metal layers of the plurality of thin film transistors in a same row are electrically connected, and the second metal layers of the plurality of thin film transistors in a same column are electrically insulated.

According to one aspect of the invention, a surface of the light-shielding metal layer adjacent to the substrate has a uniformly distributed diffuse reflection structure.

According to one aspect of the invention, a surface of the light-shielding metal layer adjacent to the substrate has a uniformly undulating wave-like structure.

Beneficial Effects

The present invention provides a first metal layer and a second metal layer in a buffer layer of a thin film transistor. The first metal layer and the second metal layer are connected to the source metal layer and the drain source metal layer through a via hole respectively. The area of the metal trace is effectively increased, and the resistance of the signal line is reduced, thereby the voltage drop on the signal line is avoid. At the same time, the first metal layer and the second metal layer are light shielding metal layers to prevent external light from entering the active region, thereby avoiding threshold voltage drift.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
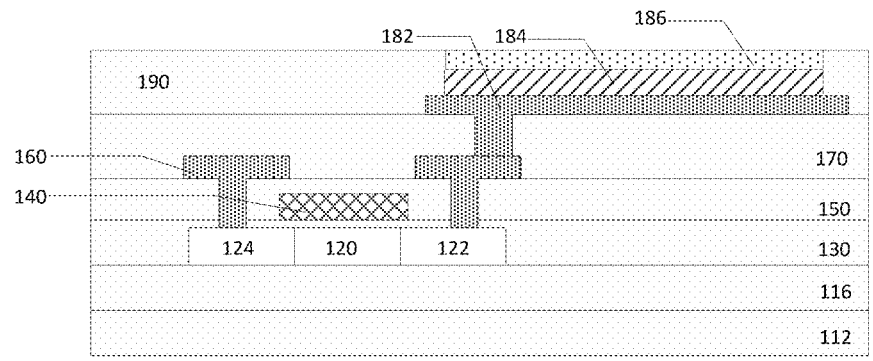
FIG. 1 is a schematic cross-sectional view of a display panel in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. Referring to FIG. 1, FIG. 1 is a schematic cross-sectional view of a display panel in the prior art. The display panel includes a substrate 112, a thin film transistor layer, and a light emitting structure.

The thin film transistor layer is located on the substrate 112 and includes a plurality of thin film transistors. Each of the thin film transistors includes: a buffer layer 116, the buffer layer 116 is located on the substrate 112; an active region, the active region is located on the buffer layer 116, the active region includes a channel region 120 and source regions 122 and drain regions 124 on both sides of the channel region 120; a gate dielectric layer 130, the gate dielectric layer 130 covering the active region; a gate metal layer 140, the gate metal layer 140 covers the gate dielectric layer 130 above the active region; an interlayer dielectric layer 150, the interlayer dielectric layer 150 covering the gate metal layer 140; a source/drain metal layer, the source/drain metal layer is located on the interlayer dielectric layer 150; a planarization layer 170 covering the source/drain metal layer and the interlayer dielectric layer 150.

The light emitting structure is disposed on the thin film transistor layer. The light emitting structure includes an anode 182, a pixel defining layer 190, a luminescent material layer 184, and a cathode 186.

The anode 182 is located on the planarization layer 170 and electrically connected to the source/drain metal layer 160 through a through hole. The pixel defining layer 190 is located on the planarization layer 172 and has a via hole exposing the anode 182. The luminescent material layer 184 is located on the anode 182 and the cathode 186 covers the luminescent material layer 184.

Referring to FIG. 1, in the prior art, for large or supersized displays, the resistance of the signal lines cannot be ignored. This resistor consumes the power supply voltage and causes uneven brightness on the display panel.

Figure 2:
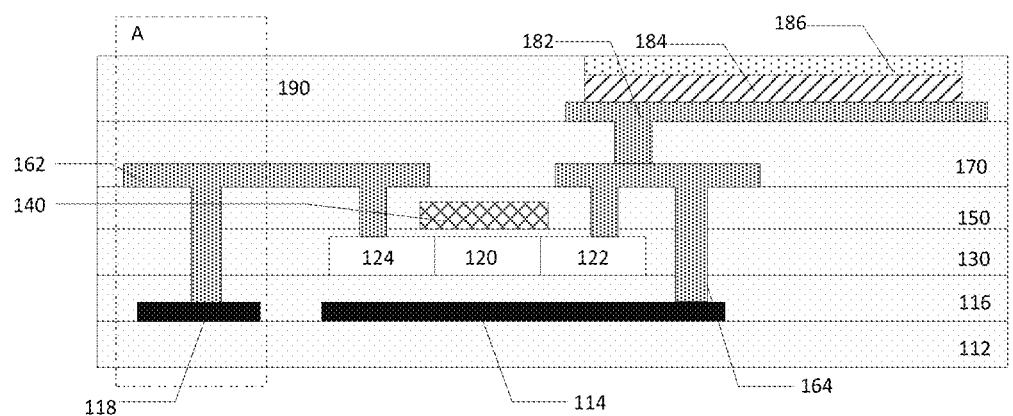
FIG. 2 is a schematic cross-sectional view of a display panel in an embodiment of the present invention.
Figure 3:
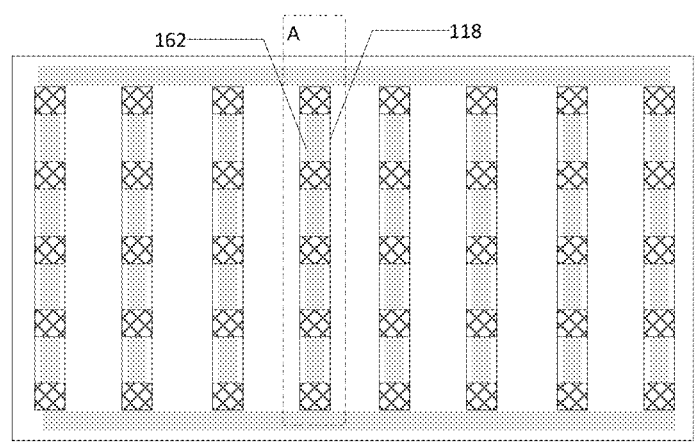
FIG. 3 is a top plane view of a part of traces of a display panel in accordance with an embodiment of the present invention.

To solve the above problems, the invention provides a display panel and an electronic device, which can effectively reduce the resistance of a signal line in the display panel. Referring to FIG. 2 and FIG. 3, FIG. 2 is a schematic cross-sectional view of a display panel in an embodiment of the present invention and FIG. 3 is a top plane view of a part of traces of a display panel in accordance with an embodiment of the present invention.

In the present embodiment, the display panel is an organic light emitting diode (OLED) display panel. In other embodiments of the present invention, the display panel may also be a liquid crystal display panel or other types.

Referring to FIG. 2, the display panel includes a substrate 112, a thin film transistor layer, and a light emitting structure.

The substrate 112 can be a rigid substrate or a flexible substrate. The rigid substrate includes glass, metal, and the like. The flexible substrate can be a variety of polymers, such as polyimide.

The thin film transistor layer is located on the substrate 112 and includes a plurality of thin film transistors. The thin film transistor includes: a first metal layer 114, a second metal layer 118, a buffer layer 116, an active region, a gate dielectric layer 130, a gate metal layer 140, an interlayer dielectric layer 150, a source metal layer 164, a drain metal layer 162, and a planarization layer 170.

The first metal layer 114 and the second metal layer 118 are located on the substrate 112. In this embodiment, the first metal layer 114 and the second metal layer 118 are electrically insulated from each other. A projection of the first metal layer 114 on the buffer layer 116 covers a projection of the active region on the buffer layer 116. Preferably, an area of the first metal layer 114 is greater than or equal to a sum of an area of the active area and an area of the source area metal layer 164. Such an arrangement enables a source region metal layer 164 to be electrically connected to the first metal layer 114 through via holes, thereby increasing the area of the source region metal layer 164 and reducing resistance of the source region metal layer 164.

A projection of the second metal layer 118 on the buffer layer 116 covers a projection of the drain metal layer 162 on the buffer layer 116. Preferably, the second metal layer 118 has the same shape and area as the drain metal layer 162. This arrangement has two advantages. On the one hand, because the second metal layer 118 and the drain metal layer 162 have a same shape, both of them can be formed by a same mask, thereby reducing the production cost. On the other hand, positions and shapes of the second metal layer 118 and the drain metal layer 162 correspond to each other and the projections of them on the buffer layer 116 overlap. Thereby positions of the through holes for realizing the electrical connection between them can be arbitrarily set according to actual conditions, which is convenient for the process.

In this embodiment, the first metal layer 114 and the second metal layer 118 are light shielding metal layers. The light shielding metal layer can effectively prevent external light from entering the active region, and effectively suppress an electronic transition of the active region. For amorphous silicon thin film transistors, the light shielding metal layer can greatly enhance the stability of the thin film transistor.

Preferably, surfaces of the first metal layer 114 and the second metal layer 118 adjacent to the substrate 112 have a uniformly distributed diffuse reflection structure. The diffuse reflective structure can be a granular frosted surface. In other embodiments, preferably, a surface of the light shielding metal layer adjacent to the substrate 112 has a uniformly undulating wave-like structure. The diffuse reflection structure and the wavy-like structure are capable of diverging and absorbing light, further enhancing the light shielding effect of the first metal layer 114 and the second metal layer 118.

In the embodiment, the buffer layer 116 covers the first metal layer 114 and the second metal layer 118. The buffer layer 116 is a semiconductor oxide or nitride, such as silicon oxide, silicon nitride, or the like.

In this embodiment, the active region covers the buffer layer 116 above the first metal layer 114. The active region includes a channel region 120 and a source region 122 and a drain region 124 on both sides of the channel region 120. The gate dielectric layer 130 covers the active region. Preferably, the gate dielectric layer 130 covers the active region and the buffer layer 116. An overall coverage saves cost by saving a mask that forms the gate dielectric layer.

In this embodiment, the gate metal layer 140 covers the gate dielectric layer 130 above the active region. The interlayer dielectric layer 150 covers the gate metal layer 140 and the gate dielectric layer 130.

In the present embodiment, as shown in FIG. 2, the source metal layer 164 is located on the interlayer dielectric layer 150 and electrically connected to the source region 122 and the first metal layer 114 through via holes. The drain metal layer 162 is located on the interlayer dielectric layer 150 and is electrically connected to the drain region 124 and the second metal layer 118 through via holes.

Referring to FIG. 3, FIG. 3 is a top plan view of a part of traces of a display panel in accordance with an embodiment of the present invention. An "A" region where the second metal layer 118 is located in FIG. 2 is a corresponding cross-sectional view of the "A" region in FIG. 3. In this embodiment, the plurality of thin film transistors are arranged in an array, the array includes at least a row of thin film transistors arranged in a first direction and at least a column of thin film transistors arranged in a second direction. Second metal layers 118 of the plurality of thin film transistors in a same row are electrically connected, and second metal layers 118 of the plurality of thin film transistors in a same column are electrically insulated.

In the embodiment, the planarization layer 170 covers the source metal layer 164, the drain metal layer 162, and the interlayer dielectric layer 150.

In this embodiment, the light emitting structure is located on the thin film transistor layer. The light emitting structure includes an anode 182, a pixel defining layer 190, a luminescent material layer 184, and a cathode 186. The anode 182 is located on the planarization layer 170 and electrically connected to the source metal layer 164 and the drain metal layer 162 through a via hole. The pixel defining layer 190 is located on the planarization layer 172 and has a via hole exposing the anode 182. The luminescent material layer 184 is located on the anode 182. The cathode 186 covers the luminescent material layer 184.

In this embodiment, in order to prevent the metal traces from affecting the light emitting effect of the display panel, a projection of the luminescent material layer on the substrate 112 does not overlap with the first metal layer 114 and the second metal layer 118.

Accordingly, the present invention also provides an electronic device comprising the display panel as described above.

The present invention provides a first metal layer and a second metal layer in a buffer layer of a thin film transistor. The first metal layer and the second metal layer are connected to the source metal layer and the drain source metal layer through a via hole respectively. The area of the metal trace is effectively increased, and the resistance of the signal line is reduced, thereby the voltage drop on the signal line is avoid. At the same time, the first metal layer and the second metal layer are light shielding metal layers to prevent external light from entering the active region, thereby avoiding a threshold voltage drift.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, wherein the display panel comprises:
   a substrate;
   a thin film transistor layer, wherein the thin film transistor layer is located on the substrate;

a light emitting structure, wherein the light emitting structure is located on the thin film transistor layer;

wherein the thin film transistor layer comprises a plurality of thin film transistors, and the thin film transistor comprises:

a first metal layer and a second metal layer located on the substrate;

a buffer layer covering the first metal layer and the second metal layer;

an active region covering the buffer layer over the first metal layer, the active region comprising a channel and a source and a drain on two sides of the channel respectively, wherein a projection of the first metal layer on the buffer layer covers a projection of the active region on the buffer layer;

a gate dielectric layer covering the active region;

a gate metal layer covering the gate dielectric layer over the active region;

an interlayer dielectric layer covering the gate metal layer;

a source metal layer located on the interlayer dielectric layer and electrically connected to the source and the first metal layer through a via hole, wherein an area of the first metal layer is greater than or equal to a sum of an area of the active region and an area of the source metal layer;

a drain metal layer located on the interlayer dielectric layer and electrically connected to the drain and the second metal layer through a via hole;

a planarization layer covering the source metal layer, the drain metal layer, and the interlayer dielectric layer.

2. The display panel according to claim 1, wherein the first metal layer and the second metal layer are light-shielding metal layers.

3. The display panel according to claim 2, wherein the light emitting structure comprises a layer of a light emitting material, a projection of the layer of the light emitting material on the substrate does not overlap with the first metal layer and the second metal layer.

4. The display panel according to claim 1, wherein the first metal layer and the second metal layer are electrically insulated.

5. The display panel according to claim 1, wherein the plurality of thin film transistors are arranged in an array, the array comprises at least a row of thin film transistors arranged in a first direction and at least a column of thin film transistors arranged in a second direction;

wherein the second metal layers of the plurality of thin film transistors in a same row are electrically connected, and the second metal layers of the plurality of thin film transistors in a same column are electrically insulated.

6. The display panel according to claim 2, wherein a surface of the light-shielding metal layer adjacent to the substrate has a uniformly distributed diffuse reflection structure.

7. The display panel according to claim 6, wherein a surface of the light-shielding metal layer adjacent to the substrate has a uniformly undulating wave-like structure.

8. An electronic device comprising a display panel, wherein the display panel comprises:

a substrate;

a thin film transistor layer, wherein the thin film transistor layer is located on the substrate;

a light emitting structure, wherein the light emitting structure is located on the thin film transistor layer;

wherein the thin film transistor layer comprises a plurality of thin film transistors, and the thin film transistor comprises:

a first metal layer and a second metal layer located on the substrate;

a buffer layer covering the first metal layer and the second metal layer;

an active region covering the buffer layer over the first metal layer, the active region comprising a channel and a source and a drain on two sides of the channel respectively, wherein a projection of the first metal layer on the buffer layer covers a projection of the active region on the buffer layer;

a gate dielectric layer covering the active region;

a gate metal layer covering the gate dielectric layer over the active region;

an interlayer dielectric layer covering the gate metal layer;

a source metal layer located on the interlayer dielectric layer and electrically connected to the source and the first metal layer through a via hole, wherein an area of the first metal layer is greater than or equal to a sum of an area of the active region and an area of the source metal layer;

a drain metal layer located on the interlayer dielectric layer and electrically connected to the drain and the second metal layer through a via hole;

a planarization layer covering the source metal layer, the drain metal layer, and the interlayer dielectric layer.

9. The electronic device according to claim 8, wherein the first metal layer and the second metal layer are light-shielding metal layers.

10. The electronic device according to claim 9, wherein the light emitting structure comprises a layer of a light emitting material, a projection of the layer of the light emitting material on the substrate does not overlap with the first metal layer and the second metal layer.

11. The electronic device according to claim 8, wherein the first metal layer and the second metal layer are electrically insulated.

12. The electronic device according to claim 8, wherein the plurality of thin film transistors are arranged in an array, the array comprises at least a row of thin film transistors arranged in a first direction and at least a column of thin film transistors arranged in a second direction;

wherein the second metal layers of the plurality of thin film transistors in a same row are electrically connected, and the second metal layers of the plurality of thin film transistors in a same column are electrically insulated.

13. The electronic device according to claim 9, wherein a surface of the light-shielding metal layer adjacent to the substrate has a uniformly distributed diffuse reflection structure.

14. The electronic device according to claim 13, wherein a surface of the light-shielding metal layer adjacent to the substrate has a uniformly undulating wave-like structure.

* * * * *